US012405359B2

(12) United States Patent
Chaudhari et al.

(10) Patent No.: US 12,405,359 B2
(45) Date of Patent: *Sep. 2, 2025

(54) TARGET MEASUREMENT DEVICE AND METHOD FOR MEASURING A TARGET

(71) Applicant: TAIWAN SEMICONDUCTOR MANUFACTURING COMPANY LTD., Hsinchu (TW)

(72) Inventors: Pradip Girdhar Chaudhari, Hsinchu (TW); Che-Hui Lee, Taipei (TW); Chih-Cheng Wei, Hsinchu (TW); Wen-Cheng Yang, Hsinchu (TW); Chyi-Tsong Ni, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 110 days.

This patent is subject to a terminal disclaimer.

(21) Appl. No.: 18/359,868

(22) Filed: Jul. 27, 2023

(65) Prior Publication Data

US 2023/0375684 A1 Nov. 23, 2023

Related U.S. Application Data

(63) Continuation of application No. 16/906,939, filed on Jun. 19, 2020, now Pat. No. 11,754,691.

(60) Provisional application No. 62/907,521, filed on Sep. 27, 2019.

(51) Int. Cl.

| | |
|---|---|
| ***G01C 3/08*** | (2006.01) |
| ***G01S 7/481*** | (2006.01) |
| ***G01S 7/497*** | (2006.01) |
| ***G01S 17/06*** | (2006.01) |

(52) U.S. Cl.

CPC .......... *G01S 7/4972* (2013.01); *G01S 7/4812* (2013.01); *G01S 17/06* (2013.01)

(58) Field of Classification Search

CPC ...... G01S 7/4972; G01S 7/4812; G01S 17/06; G01B 11/30

See application file for complete search history.

(56) References Cited

U.S. PATENT DOCUMENTS 11,754,691 B2 * 9/2023 Chaudhari ............. G01B 11/24 356/4.01

FOREIGN PATENT DOCUMENTS

JP H1161403 A * 3/1999 ........... H01L 21/203

* cited by examiner

*Primary Examiner* — Mark Hellner

(74) *Attorney, Agent, or Firm* — WPAT LAW; Anthony King

(57) ABSTRACT

A target measurement device is provided. The target measurement device includes a fixing ring, a main body, and a transceiver. The fixing ring has a first surface. The main body is over the first surface of the fixing ring. The transceiver is coupled to the main body. The transceiver is at least movable between a center of the fixing ring to an edge of the fixing ring from a top view perspective. A method for measuring a target is also provided.

20 Claims, 12 Drawing Sheets

206
30
205
204
20
102
204
101
10
10A
40A
40

TARGET MEASUREMENT DEVICE AND METHOD FOR MEASURING A TARGET

CROSS REFERENCE TO RELATED APPLICATION

This application is a continuation application claims the benefit of prior-filed U.S. application Ser. No. 16/906,939, filed on Jun. 19, 2020, and prior-filed U.S. provisional application No. 62/907,521, filed on Sep. 27, 2019, which are incorporates its entirety herein.

FIELD

The present disclosure relates to a target measurement device and a method for target measurement, particularly, the disclosed device can measure the erosion of the target used in a Physical Vapor Deposition (PVD) operation.

BACKGROUND

PVD Coating refers to a variety of thin film deposition techniques where a solid material is vaporized in a vacuum environment and deposited on substrates as a pure material or alloy composition coating.

Generally, the two most common PVD Coating processes are sputtering and thermal evaporation. Sputtering involves the bombardment of the coating material known as the target with a high energy electrical charge causing it to sputter off atoms or molecules that are deposited on a substrate like a silicon wafer or solar panel. Different from sputtering, thermal evaporation involves elevating a coating material to the boiling point in a high vacuum environment causing a vapor stream to rise in the vacuum chamber and then condense on the substrate.

Currently, PVD is widely used in the technical field of semiconductor manufacturing. The two important parts of PVD equipment are magnetron and target due to their impacts to tool availability and film performance. Thus, the accuracy of magnetron and target measurement data would directly influence to the judgement of parts replacement.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
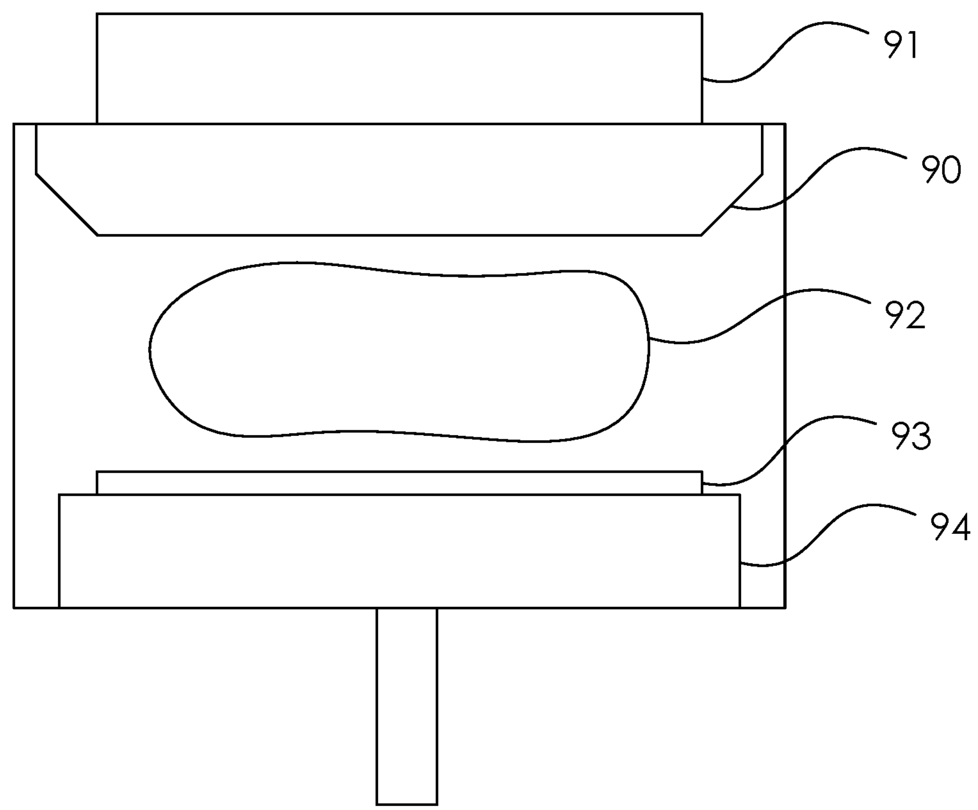
FIG. 1 illustrates a cross-sectional view of a PVD chamber according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

PVD is widely used for thin film deposition of the semiconductor manufacturing. As shown in FIG. 1, generally, a PVD equipment includes a magnetron 91 over a target 90, and a plasma region 92 is existed between the target 90 and a substrate 93, wherein the substrate 93 is supported by a pedestal 94. The magnetron 91 is configured to control the directions of plasma ions in the plasma region 92, and the target 90 is configured to provide a plurality of sputtered atoms through the collisions between the plasma ions and the target 90. That is, the plasma ions are accelerated by potentials ranging from a few hundred to a few thousand electron volts and strike the negative electrode with sufficient force to dislodge and eject atoms from the target 90. With the influence of the magnetron 91, the target material may not be consumed, or bombarded, uniformly, instead, the target material may be eroded to different extents along the radial direction. The target 90 with uneven surface may impact the uniformity of the thin films deposited on the opposing substrate 93. For instance, comparing a new target 90 to a target 90 after a 500 hours usage, the non-uniformity of a thin film formed by the target 90 after a 500 hours usage may be increased by one or more percentages, evidencing a deteriorated film thickness uniformity. Moreover, the erosion may reach to a target baseplate (e.g., the pedestal 94) and thereby removing the baseplate material and inducing wafer scrap event.

Without suitable portable tools to measure the surface profile of the target of PVD process, the evaluation of the consumption of the target would be a time-consuming work. For instance, in some circumstances, the target is removed from the PVD chamber and send to a target vender for erosion measurement. The process may take several weeks to few months and is highly inefficient.

Accordingly, some embodiments of the present disclosure provide a device and a method for target measurement to measure the erosion of the target on-site. The device for target measurement may be mounted with an installed target in a PVD chamber so that the target is not required to be completely detached from a lid of the PVD chamber.

Figure 2:
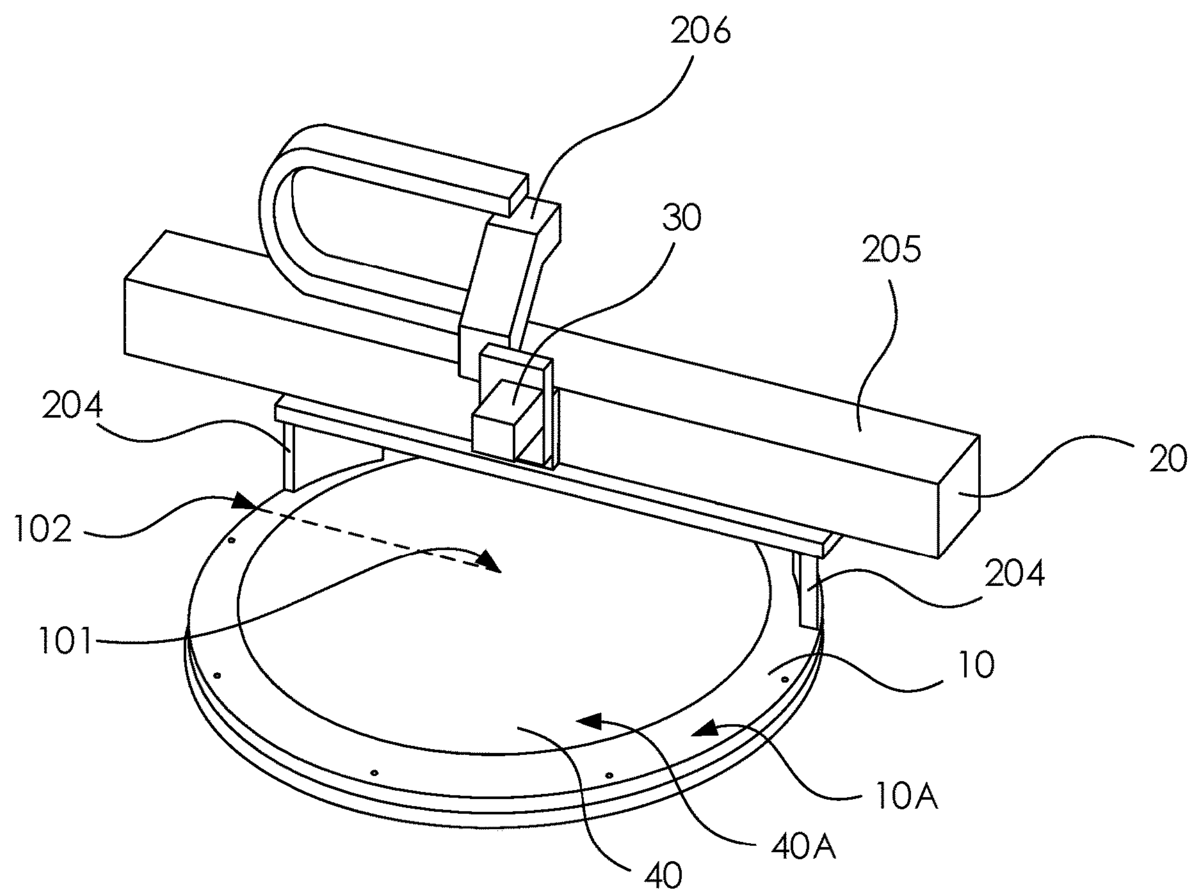
FIG. 2 illustrates a stereogram of a target measurement device according to some embodiments of the present disclosure.

FIG. 2 illustrates a target measurement device according to some embodiments of the present disclosure. The target measurement device includes a fixing ring 10, a main body 20, and a transceiver 30. The fixing ring 10 has a first surface 10A, the main body 20 is disposed over the first surface 10A of the fixing ring 10, and the transceiver 30 is coupled to the main body 20. In some embodiments, the transceiver 30 is at least movable between a center 101 of the fixing ring 10 to an edge 102 of the fixing ring 10 (i.e., the dotted line in FIG. 2).

The target measurement device of the present disclosure is utilized to measure the erosion of a target of PVD process. Referring to FIG. 2, the target 40 is disposed within the fixing ring 10 during the measurement, and the target surface 40A with erosion is facing the main body 20 and the transceiver 30. PVD process is the process which the material from a sputtering target may go from a condensed phase to a vapor phase and then back to a thin film condensed phase. To be more precisely, sputtering is a physical process whereby atoms in a solid target material are ejected into the gas phase due to bombardment of the material by energetic ions. Due to collisions, sputtering is largely driven by momentum exchange between the ions and atoms in the material. The process can be thought of as atomic billiards, with the ion (i.e., cue ball) striking a large cluster of close-packed atoms (i.e., billiard balls). Although the first collision pushes atoms deeper into the cluster, subsequent collisions between the atoms can result in some of the atoms near the target surface being ejected away from the cluster. The number of atoms ejected from the target surface per incident ion is called the sputter yield and is an important measure of the efficiency of the sputtering process.

The ejection of the atoms from the target surface 40A may induce the erosion of the target 40. Accordingly, the target 40 is disposed in the target measurement device, and the transceiver 30 thereover may scan the surface profile of the target 40. In some embodiments, the erosion of the target 40 is measured outside of the PVD equipment. That is, the target 40 is taken out from a chamber of the PVD equipment prior to the scanning or measuring operation. In such embodiments, the PVD chamber lid is opened firstly, and next, the screws for fixing the target 40 are all removed to separate the target 40 from the PVD chamber.

Figure 3A:
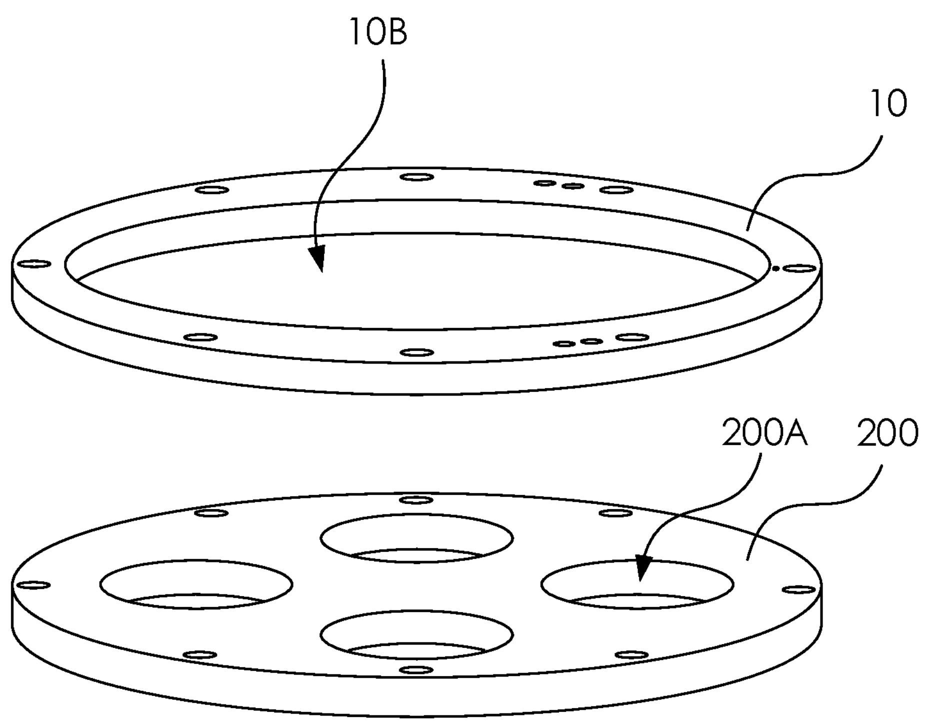
FIG. 3A illustrates a stereogram of a fixing ring and a first baseplate according to some embodiments of the present disclosure.

In some embodiments, the target 40 taken from the PVD chamber may be placed on an erosion setup baseplate under the fixing ring 10 for measurement. As shown in FIG. 3A, a space 10B is enclosed by the fixing ring 10 for disposing the target. The fixing ring 10 is disposed on first baseplate 200. The first baseplate 200 includes a flat top surface and a flat bottom surface, and it may be utilized to support the target and the fixing ring 10. In some embodiments, the first baseplate 200 may include a plurality of through holes 200A for reducing the weight of the first baseplate 200, and it is also easier to take the scanned target out of the fixing ring 10 by pushing the target from the through holes 200A.

Figure 3B:
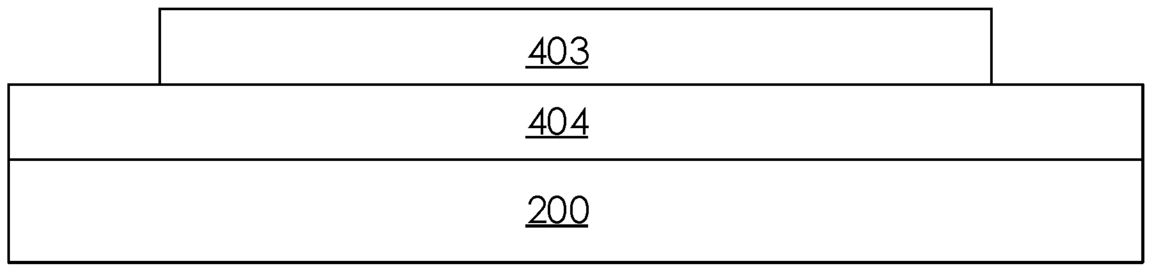
FIG. 3B illustrates a cross-sectional view of a target on a first baseplate according to some embodiments of the present disclosure.
Figure 3C:
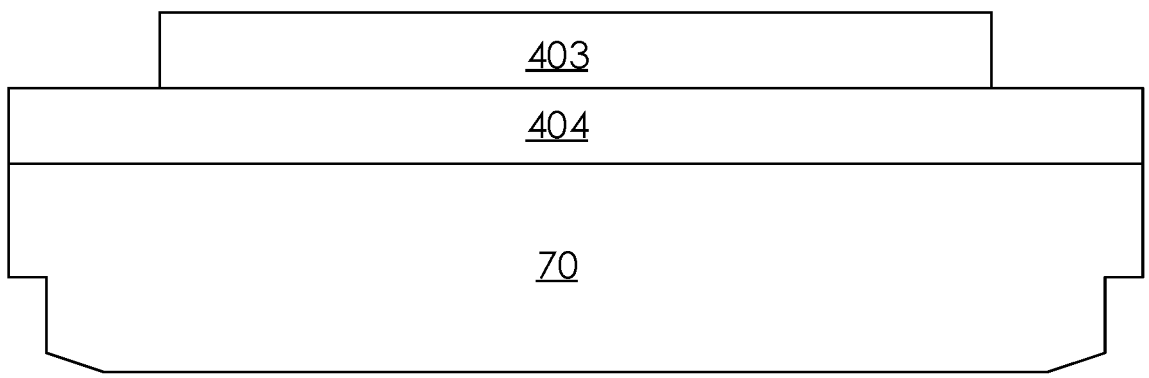
FIG. 3C illustrates a cross-sectional view of a target on a PVD chamber lid according to some embodiments of the present disclosure.

As shown in FIG. 3B, the target 40 may include an upper portion 403 for providing target material in PVD process, and a second baseplate 404 integrated with the upper portion 403 may be utilized to be installed on the first baseplate 200 out of the PVD chamber by screws; whereas in some other embodiments, as shown in FIG. 3C, the second baseplate 404 of the target 40 may be installed on an inner surface of a chamber lid 70 of the PVD chamber by screws.

Figure 4:
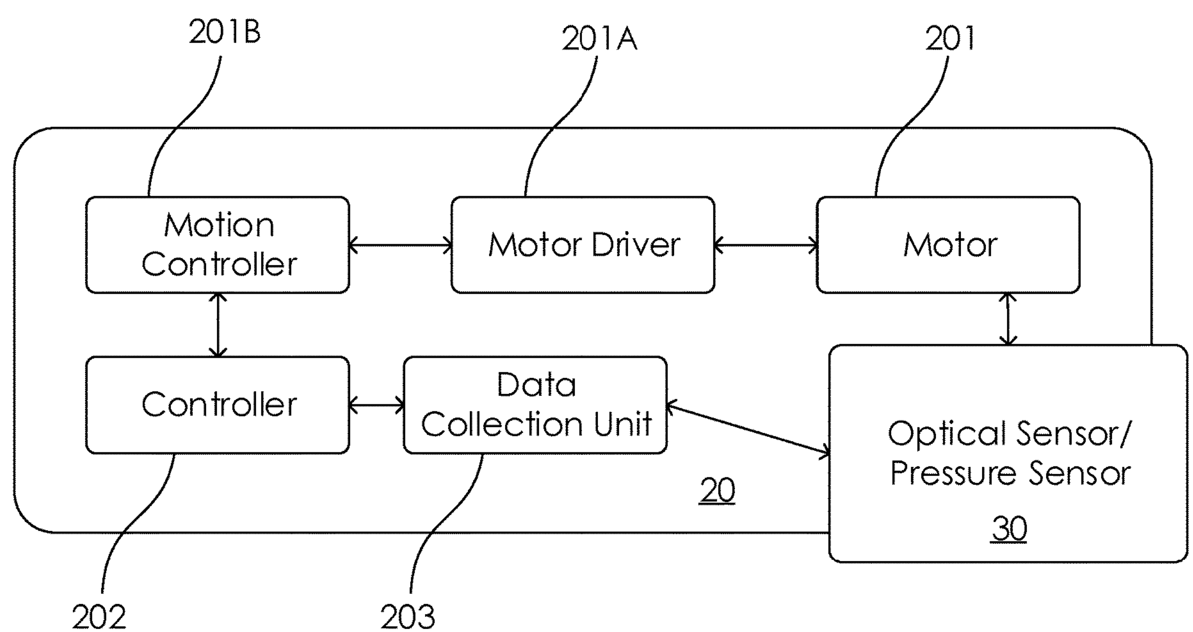
FIG. 4 illustrates a schematic diagram of a main body and a transceiver according to some embodiments of the present disclosure.

As shown in FIG. 4, in some embodiments, the main body 20 may include a motor 201 coupled to the transceiver 30, wherein the transceiver 30 may include an optical sensor or a pressure sensor, which will be describe later. The motor 201 may be utilized to move of the transceiver 30 to scan the surface profile of the target. In some embodiments, the main body 20 may further include a controller 202 coupled to the motor 201. The controller 202 may be a computer or the like, and the controller 202 is utilized to control the movement of the transceiver 30. For instance, the controller 202 may control the transceiver 30 to move along a radius or a diameter of the target. In some embodiments, the main body 20 may further include a data collection unit 203 coupled to the transceiver 30. The data collection unit 203 may collect the surface profile data of the target from the transceiver 30 for analysis. In some embodiments, the main body 20 may further include a motor driver 201A coupled to the motor 201 and a motion controller 201B coupled to the motor driver 201A and the controller 202 to control the movement of the transceiver 30 further.

Still referring to FIG. 2, in some embodiments, the main body 20 may include a pair of supporting legs 204 coupled to the fixing ring 10. The pair of supporting legs 204 may be utilized to support the components described in FIG. 4 such as the motor 201, the controller 202, the data collection unit 203, and the transceiver 30 over the fixing ring 10. In some embodiments, the main body 20 may include a bracket rail 205 over the pair of supporting legs 204. The bracket rail 205 may provide a scanning path for the transceiver 30 coupled to the main body 20. In some embodiments, the bracket rail 205 may traverse the fixing ring 10, and therefore the transceiver 30 may scan the target 40 from an edge of the fixing ring 10 to another edge thereof. In some embodiments, a measuring arm 206 may be disposed over the bracket rail 205. The measuring arm 206 may be utilized to support the transceiver 30, hence the transceiver 30 may be hung over the target 40. In some embodiments, the measuring arm 206 is configured to slide along the bracket rail 205. In such embodiments, the transceiver 30 hung by the measuring arm 206 may scan the target 40 along a diameter of the target 40 because the bracket rail 205 is parallel to the diameter of the target 40. In some embodiments, the transceiver 30 may be moved over the target 40 in x-axis and y-axis directions by the coordinate of the bracket rail 205 and the measuring arm 206. In some embodiments, the main body 20 includes a control unit in-between the measuring arm 206 and the transceiver 30, which is utilized to control the movement of the transceiver 30 in y-axis direction.

Figure 5:
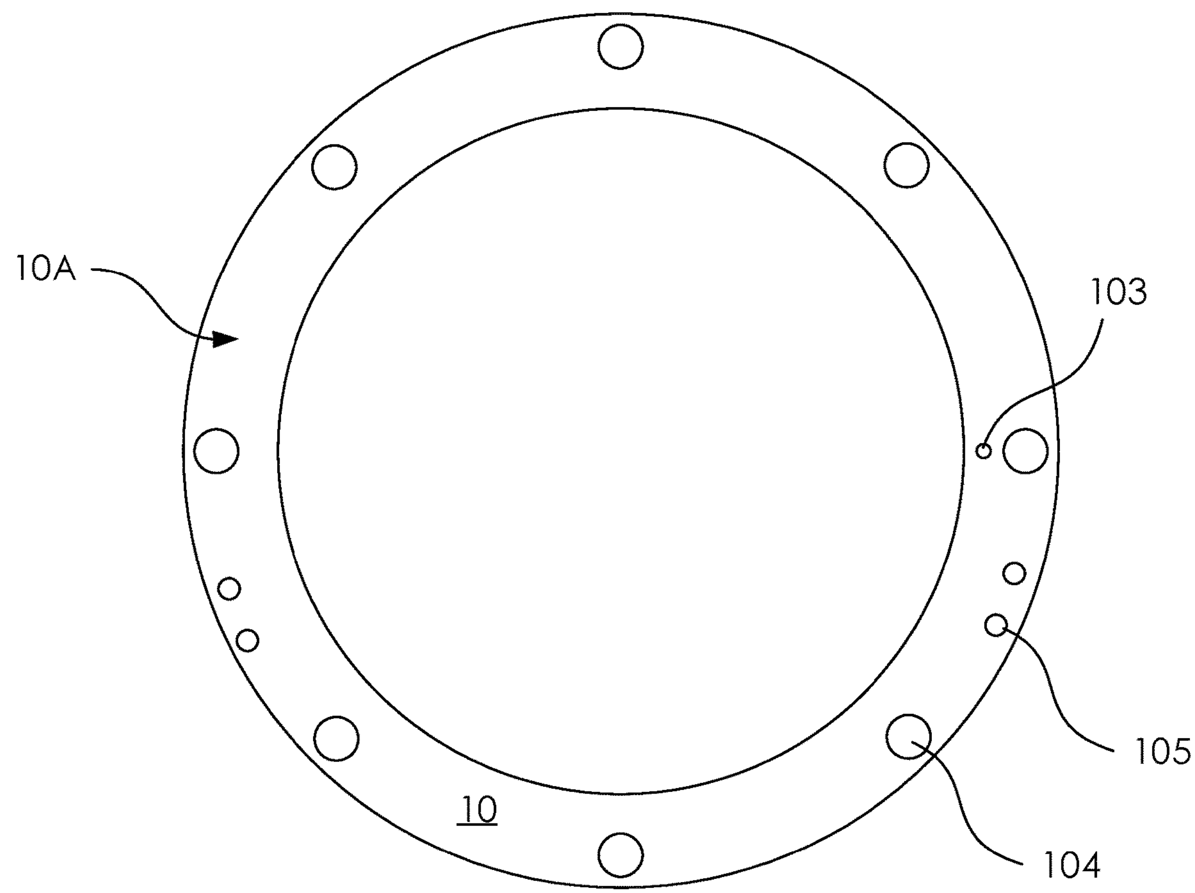
FIG. 5 illustrates a top perspective view of a fixing ring according to some embodiments of the present disclosure.

The fixing ring 10 includes a second surface opposite to the first surface 10A. Referring to FIG. 5, there are a plurality of holes at the first surface 10A of the fixing ring 10 for different usages. In some embodiments, the plurality of holes penetrate through the fixing ring 10 and thus may be observed at the second surface. In some embodiments, the plurality of holes may have different diameters. In some embodiments, the fixing ring 10 may include a plurality of first mounting holes 104 distributed evenly at the first surface 10A from a top view perspective. The fixing ring 10 may be screwed on the second baseplate 404 through the plurality of first mounting holes 104. In some embodiments, the first baseplate 200 in previously shown FIG. 3A may include a plurality of mounting holes aligned with the first mounting holes 104 for installation. In some embodiments, there are 8 first mounting holes 104 at the first surface 10A, such amount is identical to the screw holds in positioning the target in a common PVD chamber. In some embodiments, the amount of the first mounting holes 104 is identical to the screw holds in positioning the target in the PVD chamber.

In some embodiments, the fixing ring 10 may include a plurality of second mounting holes 105 distributed proximity to a side of the fixing ring 10 from a top perspective. The main body 20 may be screwed on the fixing ring 10 through the plurality of second mounting holes 105. In some embodiments, there are 4 second mounting holes 105 at the fixing ring 10. In some embodiments, the pair of supporting legs 204 as shown in FIG. 2 are screwed on the fixing ring 10 through the plurality of second mounting holes 105. Because the plurality of second mounting holes 105 are distributed proximity to the side of the fixing ring 10, the transceiver 30 coupled on the main body 20 may scan the target therebelow along a diameter of the target without obstructing by the main body 20. In other words, the positions of the plurality of second mounting holes 105 are away from the opposite edge of the fixing ring 10 to avoid obstructing the operation of scanning.

Figure 6:
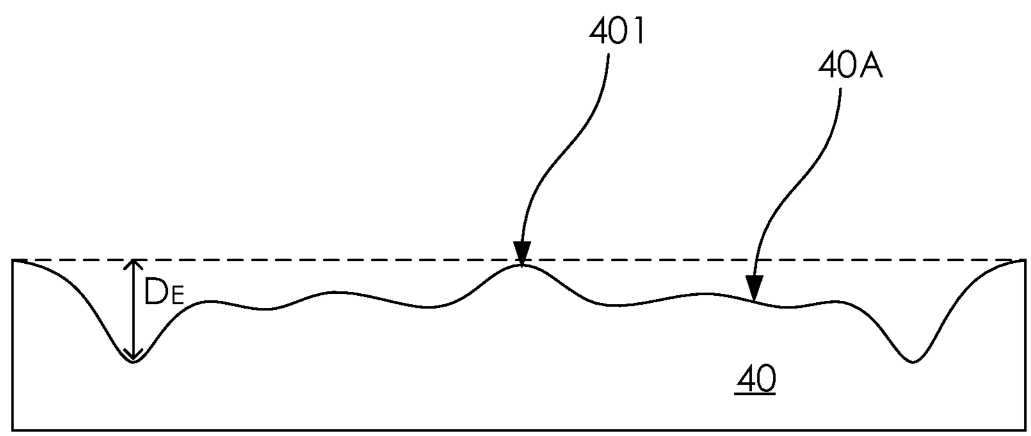
FIG. 6 illustrates a cross-sectional view of a target according to some embodiments of the present disclosure.

In some embodiments, the fixing ring 10 may include a zeroing hole 103 at the first surface 10A, and the plurality of the first and the second mounting holes 104, 105 are adjacent to the zeroing hole 103. The zeroing hole 103 is configured to be a zeroing point for scanning the target. In order to acquire the surface profile of the target, the transceiver 30 should scan the target along a radius or a diameter of the target instead of a secant line, this is because the erosion of the target may be as a circular symmetry. Referring to FIG. 6, in some circumstances, the erosion depth $D_E$ of the target 40 may be symmetric to the center 401 of the target 40, and therefore the full scanning result may be rendered by a half-scanning data, for example, by scanning the target 40 along the radius of the target 40, that is, conducting a half scan from a center to an edge of the target 40. In some other embodiments, the erosion depth $D_E$ of the target 40 may not be symmetry to the center 401 of the target, and the transceiver 30 should scan the target 40 along the diameter of the target 40 to acquire the full scanning result.

Figure 7:
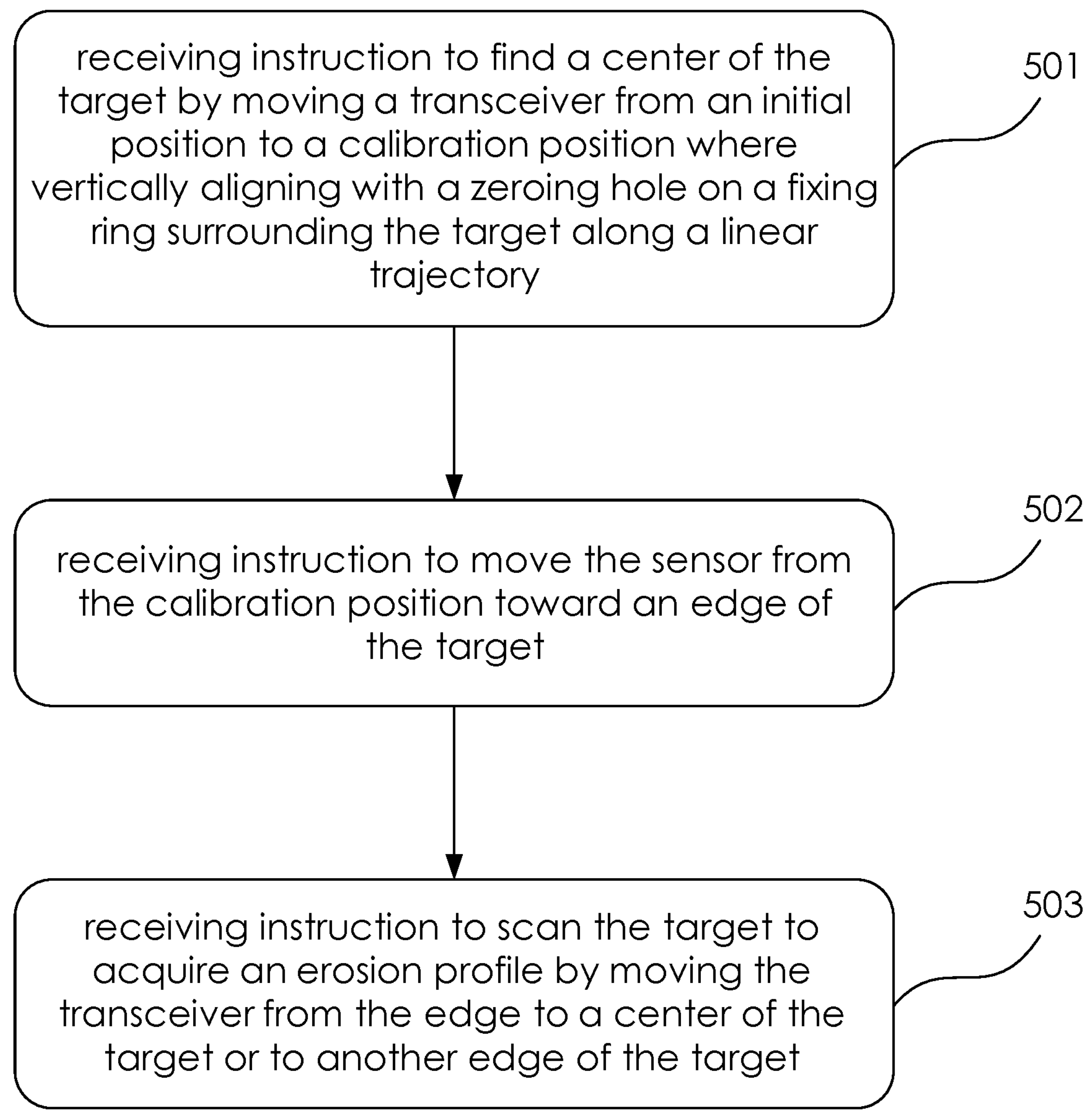
FIG. 7 illustrates a flow chart of measuring a target according to some embodiments of the present disclosure.

FIG. 7 illustrates a flow chart of measuring a target according to some embodiments of the present disclosure. In some embodiments, the measurement includes an operation 501: receiving instruction to find a center of the target by moving a transceiver from an initial position to a calibration position where vertically aligning with a zeroing hole on a fixing ring surrounding the target along a linear trajectory; an operation 502: receiving instruction to move the sensor from the calibration position toward an edge of the target; and an operation 503: receiving instruction to scan the target to acquire an erosion profile by moving the transceiver from the edge to a center of the target or to another edge of the target.

In order to scan the target along the radius or the diameter of the target, as mentioned on the operation 501, the center 401 of the target 40 needs to be confirmed prior to the operation of scanning. In some embodiments, the zeroing hole 103 at the fixing ring 10 is already lined up with the center 401 of the target 40, and therefore the transceiver 30 may find the center 401 of the target 40 along a linear trajectory if priorly registered with the zeroing hole 103. For example, before the measurement, the transceiver 30 may be located at any position above or near the target 40, and therefore in some embodiments, the transceiver 30 is moved from its current location to the zeroing hole 103 for center-finding prior to the scanning. In some embodiment, the transceiver 30 may move to the zeroing hole 103 at a first attempt, the transceiver 30 may emit a laser beam toward the first surface 10A of the fixing ring 10. Once the laser beam passes through the zeroing hole 103, the laser beam may be reflected back to the transceiver 30 by the underlying first baseplate 200 and being recognized by the controller according to a predetermine sensing mechanism, for example, the change of optical path or the property of reflected light. Center-finding operation may be confirmed if the transceiver 30 receives such recognizable sensing signal. In such embodiments, the transceiver 30 is ready to move toward the center 401 of the target 40 after the transceiver 30 is aligned and zeroed.

In some other embodiments, the transceiver 30 may fail to hit the zeroing hole 103 at the first attempt. For instance, the transceiver 30 unexpectedly deviates from the zeroing hole 103 due to software error or the controller stop to find the zeroing hole 103 when a default searching time is running out. In such circumstances, it is available to adjust the transceiver 30 along a direction perpendicular to the primary direction of the bracket rail 205, and then initiates a second attempt for the transceiver 30 to align with the zeroing hole 103. In some embodiments, the aforesaid adjustment can be done manually or automatically. The laser beam passing through the zeroing hole 103 may be deemed as that the transceiver 30 has been registered with the zeroing hole 103, therefore, the center-finding operation is completed. Subsequently, the measuring arm 206 is ready to initiate a target scan. In some embodiments, the transceiver 30 may include a pressure sensor and a gas jet (e.g., head air nozzle).

In some embodiments, an optical sensor or a pressure sensor can be devised adjacent to the bottom of the zeroing hole 103 such that the transceiver 30 may function as an emitter (e.g., a laser diode or air nozzle), while the optical sensor or a pressure sensor function as the sensor, during the center-finding operation.

In some embodiments, the transceiver 30 may include a laser beam emitter (e.g., laser diode) and an optical sensor for receiving the laser beam reflected from the target surface 40A, and the surface profile of the target 40 may be acquired accordingly. In some other embodiments, the transceiver 30 may include a gas jet (e.g., head air nozzle) and a pressure sensor for sensing the pressure of the gas impact on the target surface 40A, and the surface profile of the target 40 may be acquired accordingly.

Figure 8:
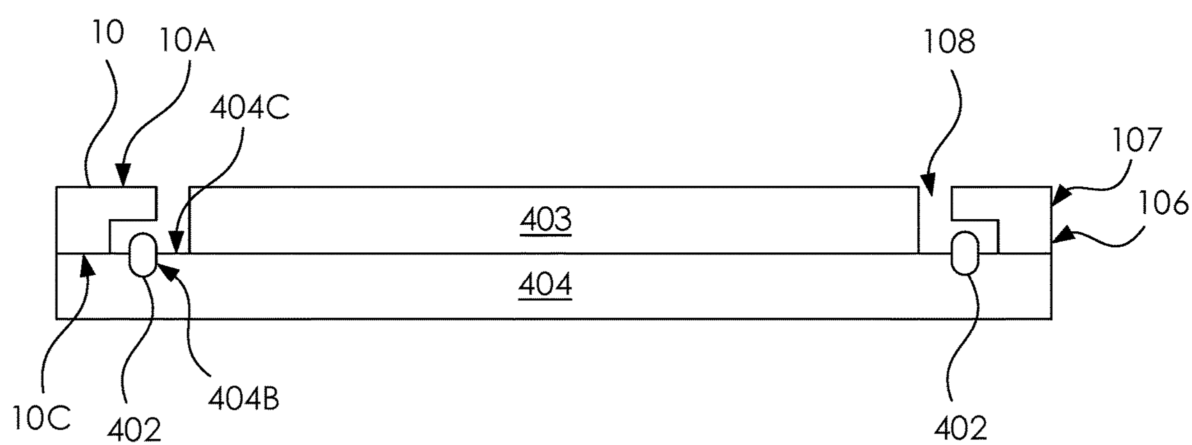
FIG. 8 illustrates a cross-sectional view of a target and a fixing ring according to some embodiments of the present disclosure.

In performing the operation 502, the transceiver 30 is moved from the calibration position (i.e., the zeroing hole 103), which is in the fixing ring 10 instead of the target, and therefore the transceiver 30 will move toward the edge of the target. As shown in FIG. 8, in some embodiment, there may be a gap 108 between the target surface 40A and the first surface 10A of the fixing ring 10. In other words, the inner edge of the fixing ring 10 and the edge of the target 40 are discontinuous, and therefore in moving the transceiver 30 toward the edge of the target 40, the gap 108 adjacent to the edge of the target 40 may be used to distinguish the surface profile of the fixing ring 10 and the target 40. That is, it will be more easily to figure out the edge of the target 40.

In some embodiments, the second baseplate 404 may have a trench 404B near the edge thereof. In some embodiments, the trench 404B is utilized to place an O-ring 402. In some embodiments, a portion of the O-ring 402 is protruded from a surface 404C of the second baseplate 404. In order to installing the fixing ring 10 around the target 40 without contacting the O-ring 402, in some embodiments, the area of the first surface 10A is larger than the second surface 10C of the fixing ring 10. That is, a lower portion 106 of the fixing ring 10 may be shrink to sidestep the O-ring 402 protruded from the surface 404C of the second baseplate 404, and the O-ring 402 is vertically covered by an upper portion 107 of the fixing ring 10. In such embodiments, the O-ring 402 need not to be removed from the trench 404B for the fixing ring 10 installation, and therefore the time spend in setting up the target measurement device may be shortened.

Figure 9:
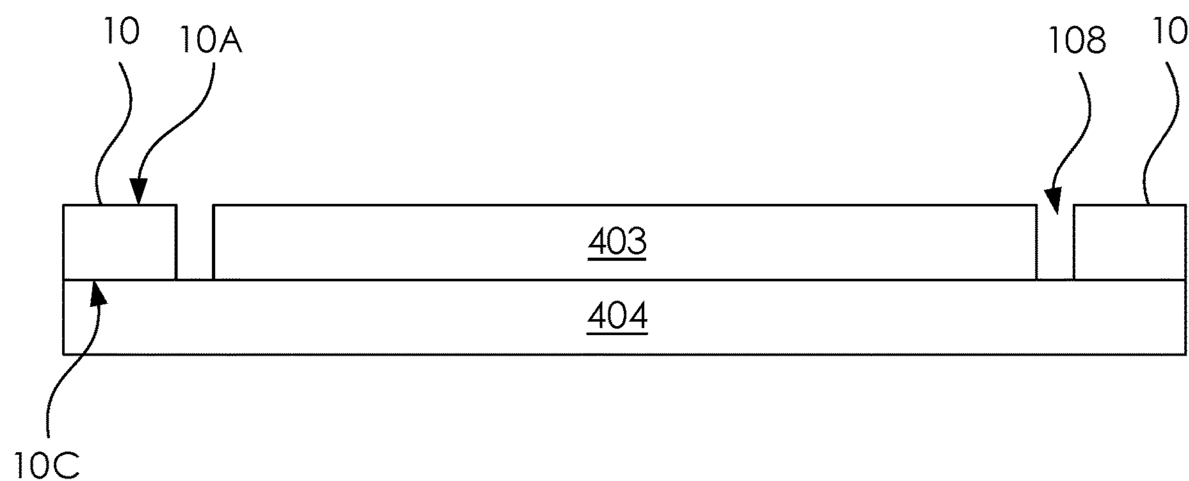
FIG. 9 illustrates a cross-sectional view of a target and a fixing ring according to some embodiments of the present disclosure.

In some other embodiments, as shown in FIG. 9, the second baseplate 404 may not include the trench or the O-ring, and the area of the first surface 10A may be identical to the second surface 10C of the fixing ring 10, which means no portion of the fixing ring 10 is shrink to sidestep the structure on the second baseplate 404.

In performing the operation 503, the transceiver 30 is moved from the edge to the center of the target 40, wherein such scanning path is already aligned by the calibration position (i.e., the zeroing hole 103), and therefore the transceiver 30 is substantially moved along the radius of the target 40. In some embodiments, the transceiver 30 is moved from the edge to another edge of the target 40, and therefore the transceiver 30 is substantially moved along the diameter of the target 40. As aforementioned, the transceiver 30 may include the optical sensor or the pressure sensor, and therefore in some embodiments, the optical sensor may receive the laser beam reflected from the surface 40A continuously to acquire the surface profile of the target 40, based on the phase shift of the power modulation of the laser beams that was sent and reflected. In some other embodiments, the pressure sensor may be worked based on the principle of pneumatic measurement, that is, it is based on a pneumatic flow meter that directly reads the drop or increase in pressure corresponding to the variation of the flow rate corresponding to the surface profile of the target. To be more precisely, there may be air passes through the head air nozzle and impact the surface of the target, and the pressure variations between the head nozzle and the surface of the target are recorded by the micro-measurement pressure gauge.

Figure 10:
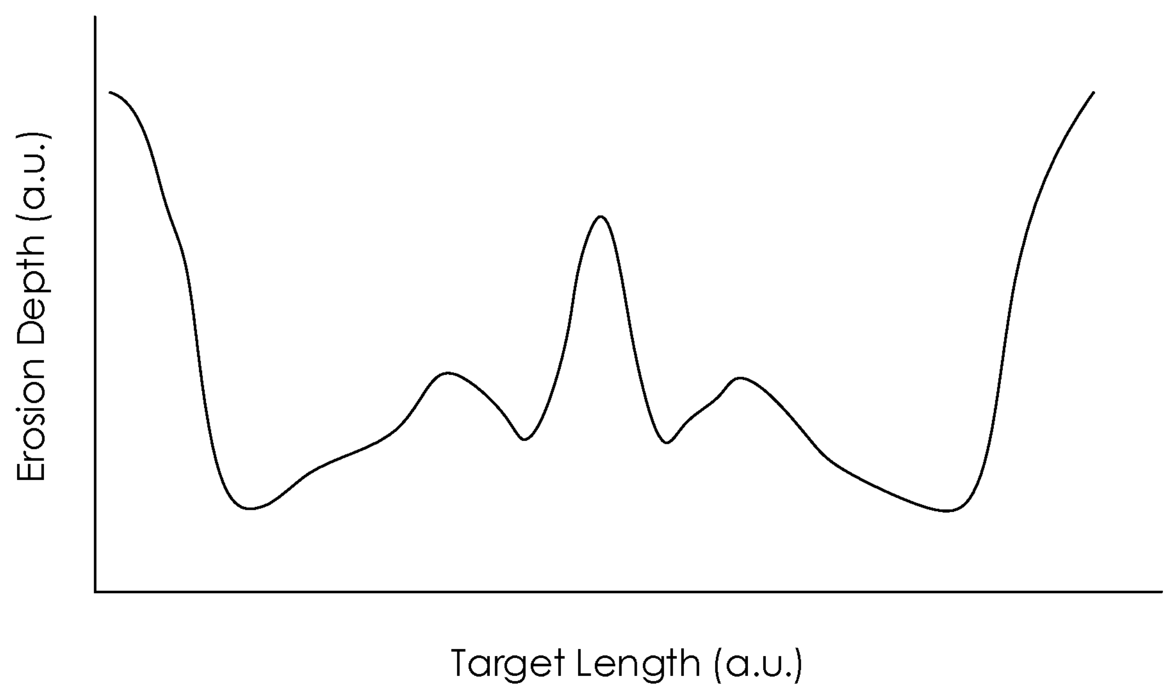
FIG. 10 illustrates a chart of erosion depth of a target according to some embodiments of the present disclosure.

By moving the transceiver over the target, referring to FIG. 10, the surface profile of the target may be scanned in several minutes, and the erosion of the target may be observed clearly. As shown in FIG. 10, after the target is used for several hundred hours, in some embodiments, the uniformity of the surface of the target is changed, and the remaining life of the target may thus be evaluated.

Figure 11:
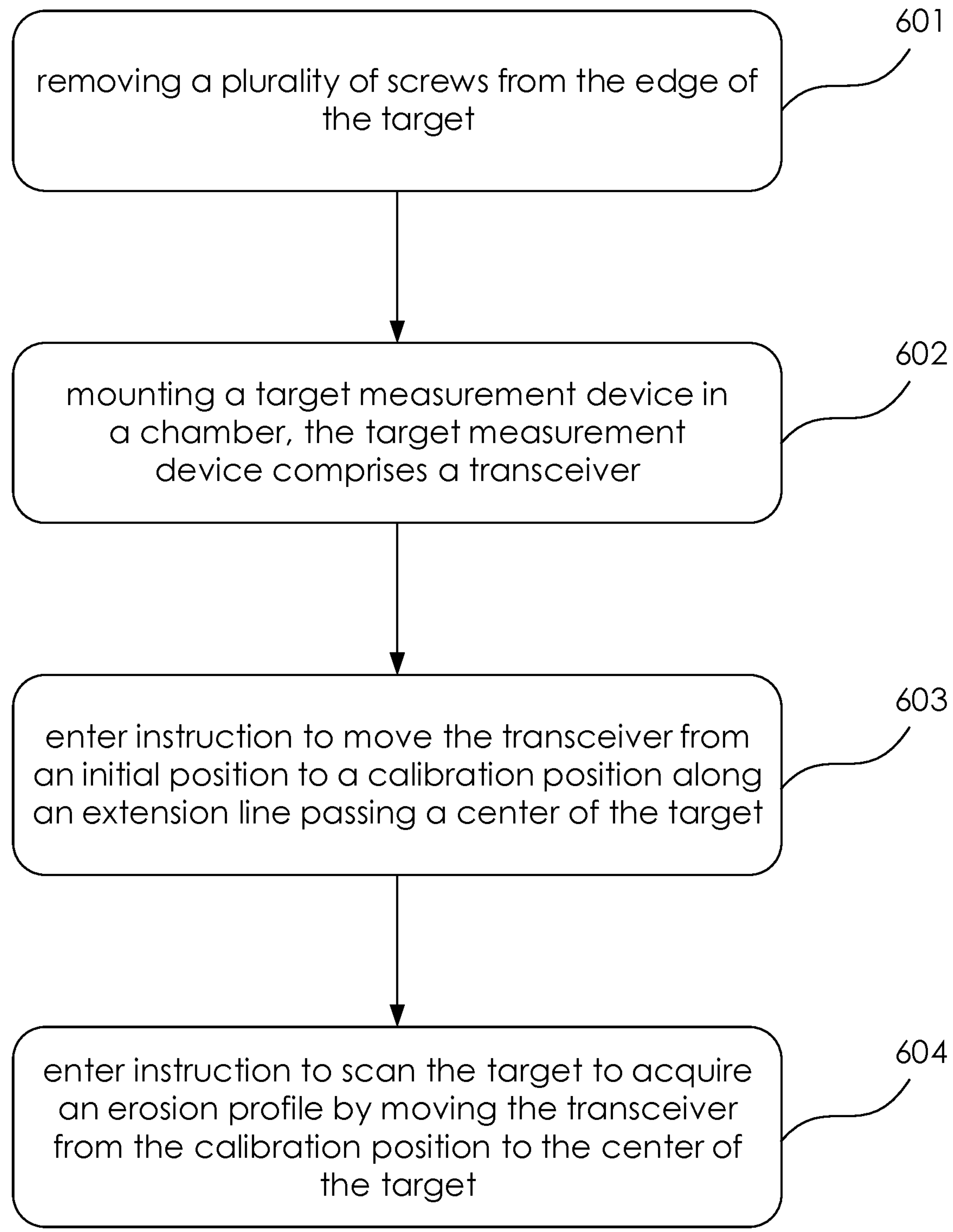
FIG. 11 illustrates a flow chart of measuring a target according to some embodiments of the present disclosure.

In some embodiments, the target may not be taken out from the PVD chamber. Referring to FIG. 11, in such embodiments, the measurement includes an operation 601: removing a plurality of screws from the edge of the target; an operation 602: mounting a target measurement device in a chamber, the target measurement device comprises a transceiver; an operation 603: enter instruction to move the transceiver from an initial position to a calibration position along an extension line passing a center of the target; and an operation 604: enter instruction to scan the target to acquire an erosion profile by moving the transceiver from the calibration position to the center of the target.

In such embodiment, the PVD chamber lid is opened and few of the screws are removed from the edge of the target. These screws are used to positioning the target, and the screw holes left by removing the screws may be used to install the fixing ring around the target prior to finding the center of the target. By mounting the target measurement device in the PVD chamber, the purpose of on-site target erosion measurement may be substantially achieved. Moreover, in such embodiments, the center of the target is also found in the operation of moving the transceiver from the initial position (i.e., any position) to the calibration position (i.e., the zeroing hole). In such operation, the transceiver may move along an extension line passing the center of the target, and the calibration position is at an end of the extension line. In some embodiments, the measuring arm may be disposed overlap the diameter of the fixing ring, and the transceiver couple to the measuring arm may be moved along the diameter of the target inside the fixing ring, wherein such path may be identical to the aforementioned extension line.

According to the present disclosure, a target measurement device and a method for measuring a target of PVD process are disclosed. The target measurement device may achieve the goal of auto on-site target erosion measurement, and therefore it may help to save measurement time and provide accurate date with a high repeatability (about 99%). The target measurement device includes a fixing ring which may mount around the target in the PVD chamber directly, without taking the target out of the chamber or removing the target O-ring. Moreover, the fixing ring include a zeroing hole as a calibration position to ensure the transceiver over the fixing ring may scan the target along a radius or a diameter correctly. By scanning the target along its radius or diameter, not only the surface profile, but the erosion depth of the target may be acquired thereby within a short time. Accordingly, a time-saving and convenient PVD target erosion measurement may be achieved.

In one exemplary aspect, a target measurement device is provided. The target measurement device includes a fixing ring, a main body, and a transceiver. The fixing ring has a first surface. The main body is over the first surface of the fixing ring. The transceiver is coupled to the main body. The transceiver is at least movable between a center of the fixing ring to an edge of the fixing ring from a top view perspective.

In another exemplary aspect, a method for measuring a target is provided. The method includes the operations as follows. An instruction to find a center of the target by moving a transceiver from an initial position to a calibration position where vertically aligning with a zeroing hole on a fixing ring surrounding the target along a linear trajectory is received. An instruction to move the transceiver from the calibration position toward an edge of the target is received.

An instruction to scan the target to acquire an erosion profile by moving the transceiver from the edge to a center of the target is received.

In yet another exemplary aspect, a method for measuring a target is provided. The method includes the operations as follows. A target measurement device is mounted in a chamber, and the target measurement device includes a transceiver. An instruction to move the transceiver from an initial position to a calibration position along an extension line passing a center of the target is entered. An instruction to scan the target to acquire an erosion profile by moving the transceiver from the calibration position to the center of the target is entered.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A target measurement device, comprising:

a fixing ring having a first surface, wherein the fixing ring comprises:

a zeroing hole at the first surface; and a plurality of mounting holes at the first surface and adjacent to the zeroing hole; and a transceiver disposed over the first surface of the fixing ring, wherein the transceiver is at least movable between a center of the fixing ring to an edge of the fixing ring from a top view perspective.

2. The target measurement device of claim 1, further comprising:

a main body disposed over the first surface of the fixing ring and coupled to the transceiver.

3. The target measurement device of claim 2, wherein the main body comprises a motor coupled to the transceiver.

4. The target measurement device of claim 3, wherein the main body further comprises a controller coupled to the motor and a data collection unit.

5. The target measurement device of claim 2, wherein the main body comprises:

a pair of supporting legs coupled to the fixing ring;

a bracket rail over the pair of supporting legs and traversing the fixing ring; and a measuring arm over the bracket rail, and the measuring arm being configured to slide along the bracket rail.

6. The target measurement device of claim 1, further comprising a baseplate under the fixing ring.

7. The target measurement device of claim 1, wherein the transceiver comprises a pressure sensor.

8. A method for measuring a target, the method comprising:

moving a transceiver to vertically align with a zeroing hole on a fixing ring surrounding the target;

moving the transceiver toward an edge of the target along a linear trajectory; and scanning the target to acquire an erosion profile of the target by moving the transceiver from the edge to a center of the target.

9. The method of claim 8, wherein the zeroing hole is lined up with a center of the target along the linear trajectory.

10. The method of claim 9, wherein the fixing ring further comprises:

a plurality of first mounting holes distributed evenly from a top view perspective; and a plurality of second mounting holes distributed in proximity to a side of the fixing ring from a top view perspective.

11. The method of claim 10, wherein the fixing ring is installed around the target through the plurality of first mounting holes.

12. The method of claim 10, wherein the transceiver is coupled to a main body, and the main body is coupled to the fixing ring through the plurality of second mounting holes.

13. The method of claim 8, wherein the fixing ring further comprises a first surface and a second surface opposite to the first surface, an area of the first surface is larger than that of the second surface.

14. The method of claim 8, further comprising:

emitting a laser beam during the movement of the transceiver.

15. The method of claim 8, wherein the target is placed on a baseplate under the fixing ring.

16. A method for measuring a target, the method comprising:

mounting a target measurement device in a chamber, the target measurement device comprises:

a fixing ring;

a bracket rail traversing over the fixing ring; and a transceiver connected to the bracket rail;

moving the transceiver from an initial position to a calibration position along an extension line passing a center of the target; and scanning the target to acquire an erosion profile of the target by moving the transceiver from the calibration position to the center of the target.

17. The method of claim 16, wherein the target measurement device further comprises:

a measuring arm, disposed over the bracket rail and bearing the transceiver, wherein the measuring arm slides along the bracket rail thereby moving the transceiver form the initial position to the calibration position; and a pair of support legs, supporting the bracket rail on the fixing ring.

18. The method of claim 16, wherein the operation of mounting the target measurement device in the chamber comprises installing the fixing ring around the target.

19. The method of claim 16, further comprising:

removing a plurality of screws configured to fix the target prior to mounting the target measurement device in the chamber.

20. The method of claim 16, further comprising:

moving the transceiver to align with the calibration position manually when the transceiver failed to move to the calibration position;

wherein the calibration position is a zeroing hole at the fixing ring.

* * * * *